United States Patent
Christensen, Sr.

(10) Patent No.: US 6,229,259 B1
(45) Date of Patent: May 8, 2001

(54) WOVEN POLYMER FIBER VIDEO DISPLAYS WITH IMPROVED EFFICIENCY AND ECONOMY OF MANUFACTURE

(76) Inventor: Alton O. Christensen, Sr., 16106 S. Ravenswood, Magnolia, TX (US) 77355-1233

(*) Notice: Subject to any disclaimer, the term of this patent is extended or adjusted under 35 U.S.C. 154(b) by 0 days.

(21) Appl. No.: 09/218,233

(22) Filed: Dec. 22, 1998

(51) Int. Cl.$^7$ .................................................. H05B 33/00

(52) U.S. Cl. .......................... 313/498; 313/506; 257/40

(58) Field of Search .................................. 313/498, 499, 313/500, 506, 511; 428/690, 917; 257/40

(56) References Cited

U.S. PATENT DOCUMENTS

| | | | |
|---|---|---|---|
| 4,849,673 | * | 7/1989 | Werring et al. ................... 313/498 X |
| 5,747,928 | * | 5/1998 | Shamnks et al. ..................... 313/498 |
| 6,008,588 | * | 12/1999 | Fuji ................................. 313/498 X |

\* cited by examiner

*Primary Examiner*—Ashok Patel
(74) *Attorney, Agent, or Firm*—Thomason, Moser & Patterson, L.L.P.

(57) ABSTRACT

A flat-panel video display woven of dielectric, conducting and semiconducting fibers is disclosed. The display device is fabricated from a warp and woof fabric of gated triode devices including red, green and blue gated electroluminescent (EL) devices, address devices, and controlling logic elements. The fibers and dimensions thereof substitute for and eliminate expensive deposition and photolithography steps of prior art. Insulating (dielectric) and metal fibers bear the warp and woof stress of a weaving loom used to fabricate the fabric display. Pixel density of the display is proportional to the EL polymer fiber width ranging from submicron to millimeter. For constant pixel density at increasing display size, the thickness of the stressed fibers, and of the display panel, increases. The resulting display has an overall area, or number of displays of a woven batch, limited only by the weaving loom's capability and the breaking point of the insulating fibers used to bear stress. The woven display pixel density can be superior to that of cathode ray tubes (CRTs), and is suitable for automotive, head-mounted, wearable, portable, large area high density television (HDTV), warfighter and tactical commanders' displays. Triode devices produce red, green and blue EL by gate-controlled avalanche processes, more efficient with higher luminous output than the prior art tunneling method. The non-tunneling device source contact, which enables gate-control, also blocks hole current for more efficient luminescent carrier recombination. The fabric comprising the pixels and control circuitry is encapsulated in a polymer having advantageous optical interface parameters with the luminescent face of pixels.

12 Claims, 4 Drawing Sheets

WOVEN POLYMER FIBER VIDEO DISPLAYS WITH IMPROVED EFFICIENCY AND ECONOMY OF MANUFACTURE

BACKGROUND OF THE DISCLOSURE

1. Field of the Invention

This disclosure is directed toward flat-panel video displays, and is more particularly directed toward improvements in performance, efficiency and manufacturing economy of displays employing electroluminescent polymer materials.

2. Background of the Art

U.S. Pat. Nos. 4,663,559, 5,656,883 and E.P.S. 0.288.616 B1, all to Alton O. Christensen, (Christensen) disclose a true-ohmic, no-barrier, non-tunneling, injecting contact between the low work function metal $Cr_3Si$ and $SiO_2$ (silica) as a n-type semiconductor, co-deposited as a cermet. Contact equilibrium accumulates the silica conduction band with electrons. Those electrons are less than 1 eV, typically 0.6 eV from vacuum level. In the present disclosure, that same interface physics is extended to an injecting, non-tunneling ohmic contact obtained between the cermet and n-type polymer semiconductors and electroluminescent (EL) material. That contact at equilibrium injects electrons into the polymer semiconductor conduction band, prohibits tunneling, and permits only minimal hole conduction. The ohmic contact to EL semiconducting polymers allows a third, gate terminal to be effective in controlling avalanche in the semiconductor. The cermet contact to EL polymer blocks hole current flow, increases EL carrier recombination, and improves efficiency and luminous output over prior art tunneling EL.

Polymers woven into fabric are well known. A class of such polymers, consisting of microfibers of micron and sub-micron dimension, is woven into silk-like fabrics. The ability of certain co-polymers to emit light has been known for less than two decades. Selected conjugate or ladder-type polymers may have dielectric, resistive, thermal conductivity, n or p type conductivity and EL properties. Entities presently exploring such polymers include the University of California at Santa Barbara and its cooperating company UNIAX, and Cambridge Display Technology cooperates with Cambridge University's co-polymer work. Christensen Technologies, Inc. funds development of the present invention at North Carolina State University.

All prior art EL polymer displays suffer from at least the following significant properties and deficiencies which affect luminous output, efficiency of EL, reliability, life and economics of manufacture:

(a) EL is generated from diode devices by tunneling though a source-contact barrier. The efficiency of luminescence of the prior art is low, as illustrated in "Carrier Tunneling and Device Characteristics in Polymer Light-Emitting Diodes", *J. Appl. Phys.* 75, (3), Feb. 1, 1994.

(b) Attempts to increase luminous output by increased field across the barrier, and current through the polymer, causes polymer melting.

(c) Tunneling through the contact barrier causes accumulated stress and change in barrier tunneling parameters, resulting in luminous intensity loss and shortened operating life.

(d) The EL devices are diodes increasing the difficulty of pixel selection and control of luminous intensity.

(e) Deposition and photolithographic definition of EL devices is costly.

(f) The area and pixel density of a display is limited by deposition and photolithography equipment's' capabilities and definition.

In view of the above properties and deficiencies of prior EL polymer displays, objects of the present invention are summarized below.

A primary object of the present invention is to provide a woven fabric of semiconductor fibers of electroluminescent (EL), n and p types, together with conductors and insulators, organized in the warp and woof of a weaving loom, to form, interconnect and produce a full color, full function video display of high luminous intensity, definition and area suitable for any video system.

An additional object of the present invention is to create EL by controlled non-destructive avalanche, rather than by tunneling, of carriers in polymer EL semiconductor thereby increasing efficiency and luminous output.

Another object of the present invention is to provide a triode, gated, EL device, and controlling avalanche and luminous intensity by bias potentials supplied to the gate, together with source-drain potentials of the nominal values used in integrated circuits.

Yet another object of present invention is to assure gate control of avalanche EL in an EL device, rather than tunneling of the prior art, by forming a no-barrier, non-tunneling contact between cermet and the EL device source.

Still another object of the present invention is to increase the efficiency of luminous output of an EL device by effect of the cermet source contact which minimizes hole current and increases EL recombination.

Another object of the present invention is to provide a longer, more reliable operating life for an EL device by eliminating the tunneling contact stresses of prior art, and by use of a gate to produce and control the avalanche and luminous intensity.

Still another object of the present invention is to provide manufacturing economies of the textile industry to the manufacture of video displays.

A further object is to weave and interconnect complementary address and other logic devices to provide address and modulation of pixel color and luminous intensity.

There are other advantages and applications of the present invention which will become apparent in the following disclosure to those skilled in the art.

SUMMARY OF THE INVENTION

The fabric display device of the present disclosure is manufactured by weaving or knitting particular inorganic and organic materials that are formed into fibers. Polymer fibers, preferably in the form of thread, are used for EL, and dielectric isolation. Metals or cermets. preferably in the form of thread, are used for interconnection conductive polymer. Constituent fiber dimensions determine the size of the display device. Fiber width of all materials of the display can vary from sub-micron to millimeter dimensions. Size of the overall display is limited by the tensile strength of interwoven dielectric fibers. These fibers bear the stress of the looming of the display fabric, and are allowed to stretch as long as functional integrity is maintained. In weaving, recall that "woof" refers to threads woven back and forth across fixed threads of the "warp" in a loom. In the context of the present disclosure, the length at which fiber strength fails and at which the fiber breaks determines the maximum dimension of warp and woof of the weaving loom. Pixel density of the display is proportional to the EL polymer fiber width, where the least display area has the highest pixel density. For a constant pixel density as display area increases, the thickness of the insulating fibers are increased to withstand the increased warp and woof tensions of the loom, thereby increasing the overall thickness of the display panel. The resulting fabric display has an overall area, or number of displays of a woven batch, limited only by the weaving loom's capability and the breaking point of the insulating fibers used. A full color flat-panel display can be as thin, front-to-back including encapsulation, of less than one-half inch. The display retains operational performance with mechanical flexing The expense of fabrication of the woven display is greatly reduced when compared with prior art device fabrication expenses. More specifically, expensive deposition and photolithography equipment is not required when a display is woven. Furthermore, a highly controlled fabrication environment is not required when the display is woven. Still further, high cost of operating prior art deposition and photolithology equipment is essentially eliminated by weaving the display fabric. Now turning to device performance specifications, prior art EL devices are diodes, without the associated advantages of the triode embodiments of the present disclosure. In prior art display devices, the source contact barrier controls the tunneling, and therefor limits EL brightness and efficiency.

The non-tunneling contact to n-type EL and semiconductors of the present disclosure is the contact which (1) allows the triode device gate embodiment, (2) the potential applied thereto, and (3) its barrier to semiconductor to regulate a more efficient controlled avalanche process. That, in turn, produces brighter EL, and also produces more efficiency in EL address and logic devices of the display.

The present invention extends the prior art of the Christensen cermet used in field emitters, U.S. Pat. Nos. 4,663,559, 5,656,883 and E.P.S. 0.288.616 B1, which are assigned to the assignee of the present disclosure, and are incorporated herein by reference. Briefly, the application of the ohmic contact cermet disclosed therein provides:

(a) a cermet of $Cr_3Si$ and $SiO_2$ obtains a vacuum barrier of less than 1 eV, and typically about 0.6 eV with a field applied there across; and (b) that vacuum barrier is sufficiently low, for cermet in contact with n-type polymer EL and polymer semiconductors, to form an injecting, non-tunneling ohmic contact therebetween.

It is not an object of the present invention to disclose, make claim or specify concerning any materials, other than in generic terms such as red, green or blue EL, polymer semiconductor, or insulating or conducting fibers such as given in the TABLE, below. In the preferred embodiments of the woven fabric display, fibers of selected materials are fabricated into electroluminescent (EL) red (R), green (G), and blue (B) pixels, semiconductor devices for address, or logic functions.

In the preferred embodiment of the woven display, gate-controlled avalanche processes create EL. The cermet contact to the device source produces no barrier to electron flow and injection into the EL and polymer semiconductors. The conductive gate element has both a barrier to semiconductor and an applied potential. The shape of the gate electrodes are made narrow in the dimension parallel to the source and drain contacts to effectively enhance the field created by an applied gate potential. In the avalanche electron-hole pairs are created. Only recombination of those carrier pairs in the semiconductor produces EL. The cermet contact has a factor of about $10^{-6}$ less mobility for holes, thereby prohibiting hole current flow and recombination other than in the semiconductor. To achieve equilibrium, the holes must recombine with electrons in the semiconductor, producing more efficient EL and luminous output, compared to prior art display devices.

For n-type polymers, an applied negative gate potential, sufficient to overcome the gate-to-semiconductor barrier and to exert a field in the n-type semiconductor, depletes that volume of electrons. If then a sufficient positive source-to-drain potential is applied, avalanche occurs. The magnitude of the avalanche current is controlled by both gate and source potentials proportionately. When the gate potential is removed, avalanche ceases and EL recombination continues in the semiconductor until equilibrium. is achieved. For p-type polymers the gate potential is made positive to deplete holes in the semiconductor. Avalanche occurs and is controlled as in n-type polymer. Thus, gate-controlled avalanche current magnitude produces greater EL efficiency and brightness as compared to carrier tunneling of the prior art devices.

Gate-controlled avalanche devices are also organized to charge or discharge gates of EL devices, and to control the address and logic devices required for management of information and video display.

In display devices, the space between pixels and their respective R, G and B color emissive areas requires electrical insulation and blocking absorption of light emission. Absorption of emission by a suitable material is detailed in the literature under a generic term "black matrix". Pixel color areas of the present woven display fabric are defined, and insulated each from the other, by weaving the black matrix material alongside and under the EL polymers, thereby defining pixel area. In the present display fabric, the black matrix is preferably woven of fibers of a black dyed dielectric, high resistivity polymer, or drawn microfibers of a-SiGe-H.

BRIEF DESCRIPTION OF THE DRAWINGS

So that the manner in which the above recited features, advantages and objects of the present invention are obtained and can be understood in detail, more particular description of the invention, briefly summarized above, may be had by reference to the embodiment thereof illustrated in the appended drawings.

In viewing the appended drawings, it must be understood that all fibers, shown in terraced layers and truncated lengths for clarity, extend the lull width of the warp and woof of the weaving loom.

DETAILED DESCRIPTION OF THE PREFERRED EMBODIMENTS

As stated previously, it is not an object of the present invention to disclose, make claim or specify concerning any materials, other than in generic terms such as red, green or blue EL, polymer semiconductor, or insulating or conducting fibers such as given in the TABLE, below.

In the preferred embodiment of the woven fabric display, fibers of selected materials and preferably in the form of thread suitable for weaving, are fabricated into electroluminescent (EL) red (R), green (G) and blue (B) pixels, semiconductor devices for address, or logic functions. Fiber materials of the preferred embodiment include, but are not limited to those tabulated below:

TABLE

| Materials | Use |
| --- | --- |
| Organic. | |
| Conjugate and ladder-type n and p polymers. | R, G and B pixels crystalize under stress |
| Co-polymers | p-type semiconductor |
| Doped polyaniline | $10^{13}$ Ω/square insulator |
| Doped polyaniline exposed to deep UV | $0.1\ cm^2$/Vsec. mobility |
| Oligophenyl-based p-4p to p-6p | |
| Inorganic: | |
| a-SiGe-H (black, light, absorber) | electrical and photo isolation |
| Nanoglass | spinnable low k dielectric |
| Metals Al, Au, Cu | gate, contact and interconnect |
| Cermet of $Cr_3Si$ and $SiO_2$ | no-barrier contact to n-type |

COMPLEMENTARY ROW ADDRESS DEVICE

Figure 1A:
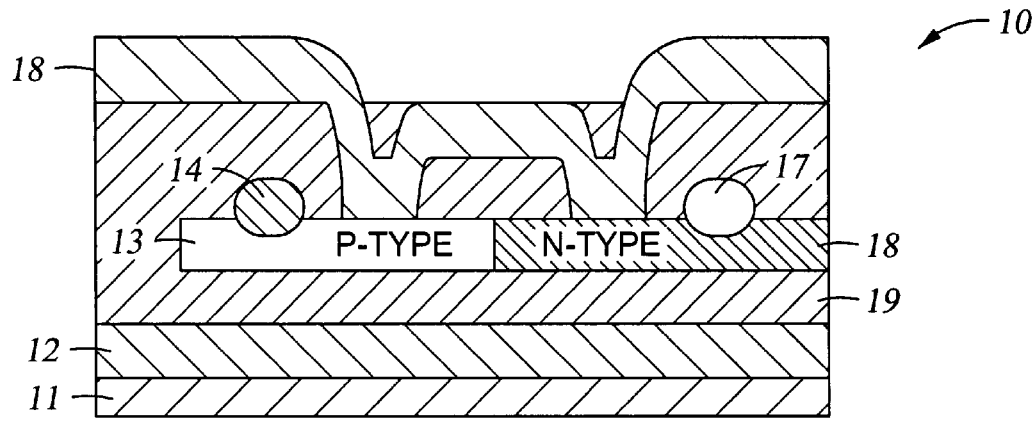
FIG. 1a is a partial section view of a complementary row address device.
Figure 1B:
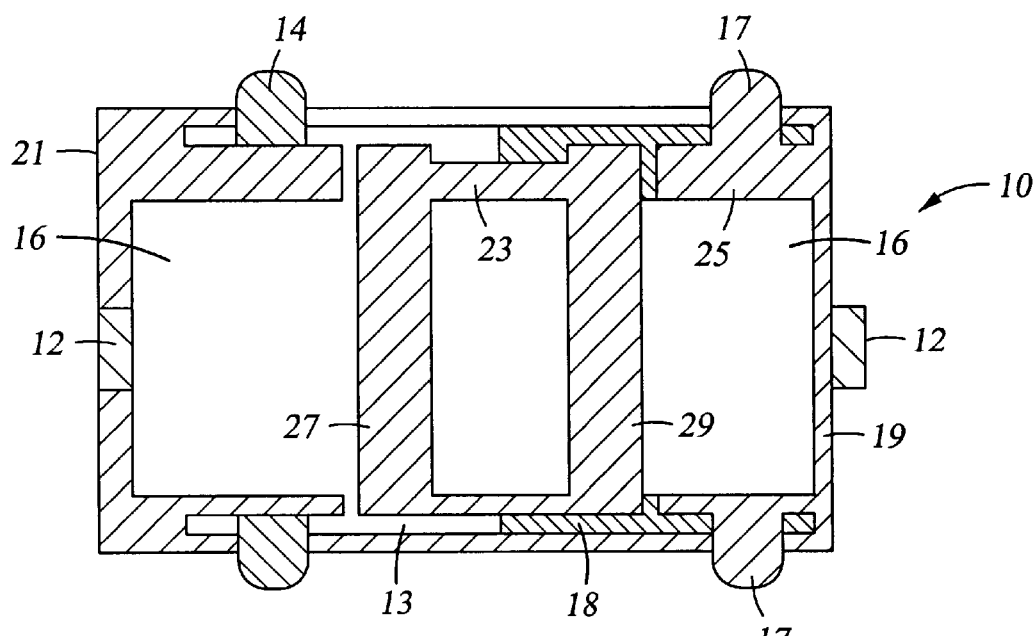
FIG. 1b is a partial planar view of a complementary row address device.

Attention is first directed to both FIGS. 1a and 1b, which show a sectional and planar view, respectively, of a woven device. It is again emphasized that all fibers extend to their respective loom edges, and planar and sectional views are truncated and terraced for clarity of illustration. The numeral 10 generally designates a woven complementary inverter or row address device of the display fabric in a partial sectional view. The device 10 is a logic inverter, formed on a transparent substrate 11, and has a p-type polymer semiconductor 13 and n-type semiconductor 18, a source metal conductor 14, and a common output terminal 12 of preferably gold fiber. The output terminal 12 is insulated from the semiconductor 13 and the semiconductor 18 by a dielectric fiber 19. The n-type semiconductor 18 has the device drain contact metal 17 of the cermet. The device 10 also has a barrier contact metal gate 16 to semiconductors 13 and 18, insulated from other elements by woven dielectrics 15, 19, 21, 23 and 25. Dielectrics 21 and 25 are in tension to provide a force to the contact between the gold fiber 14 and the semiconductor 13, and between drain contact metal 17 and the semiconductor 18, respectively. The shape of the gate electrode 16 is made narrow in the dimension parallel to the source 14 and drain 17 contacts to effectively enhance the field created in semiconductors 13 and 18 by an applied gate potential. The transparent substrate 11 can be transparent fiber material integrally woven with the other fiber elements of the device. Alternately, the woven device can be subsequently attached to the transparent substrate 11.

Referring again to both FIGS. 1a and 1b, conductor 14 makes ohmic contact to the p-type semiconductor 13. Conductor 17 makes ohmic contact to the n-type semiconductor 18. Such ohmic contacts allow the gate 16 solely to produce a depletion region in the semiconductors 13 and 18, and to control the conduction path between the source 14 and the output 12 and the drain 17 to either OFF or AVALANCHE conditions, depending upon the potential applied to the gate 16.

FIG. 1b shows the device 10 in planar view. In this view, dielectric insulator fibers 27 and 29 are in tension from the loom, and therefore provide a force to the contact of the source 14 to the semiconductor 13, and the drain 17 to semiconductor 18, respectively. In operation, a positive potential is supplied to the device through the source conductor 14 to the p-type polymer semiconductor 13. The drain terminal 17 of the woven inverter is placed at a ground or negative potential relative to source 14. The gate 16, when driven positive by a logic signal, toward the potential of the source 14, causes the n polymer semiconductor 18 to avalanche, bringing the output terminal 12 toward the potential of the drain 17. When the gate 16 is driven toward potential of source 14 by a negative logic signal, the p polymer semiconductor 13 avalanches, bringing the output terminal 12 toward the potential of the drain.

PIXEL DEVICE

Figure 2A:
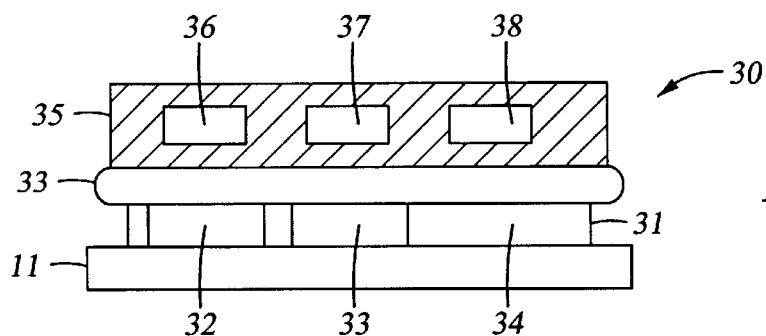
FIG. 2a is a first partial sectional view of two rows of red, green and blue woven, gated, EL pixels.
Figure 2B:
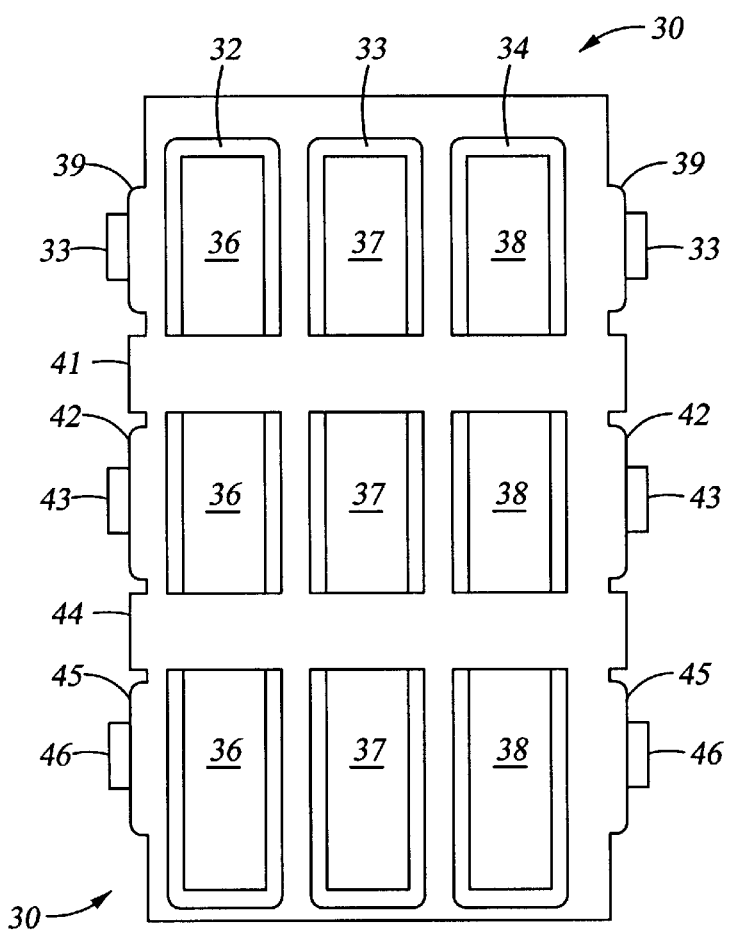
FIG. 2b is a first partial planar view of the two rows of red, green and blue pixels.
Figure 2C:
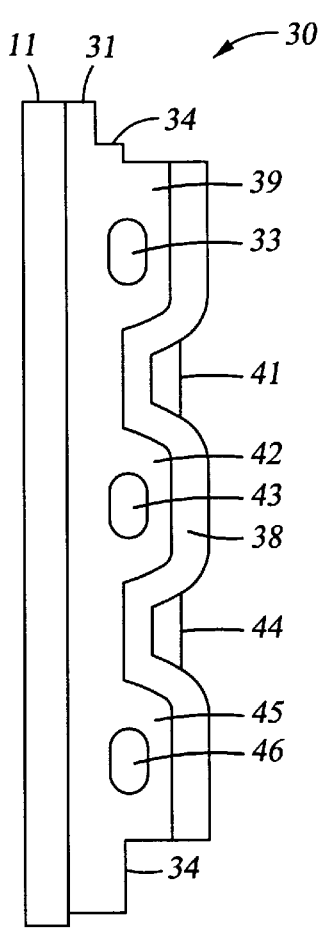
FIG. 2c is a second partial sectional view of the two rows of red, green and blue pixels.

Attention is now directed collectively to FIGS. 2a, 2b and 2c depicting woven, gated, EL pixel device. As in FIGS. 1a and 1b, it is emphasized that all fibers shown in FIGS. 2a, 2b and 2c extend to their respective loom edges, and planar and sectional views are truncated and terraced for clarity of illustration. In FIG. 2a, the numeral 30 generally designates two rows of one column of red, green and blue pixels of the woven display in partial sectional view. The devices 30 are formed on a transparent substrate 11 whose optical characteristics are matched to the luminous output of the pixels. Red, green and blue EL semiconductor polymers are indicated by 32, 33 and 34, respectively, each surrounded by a black matrix material 31. Each color pixel is comprised of an EL polymer 32, 33 or 34, with gate metal 36, 37 or 38, respectively, of gold fiber, a common cermet source contact 43 (see FIGS. 2b and 2c), and a common drain metal contact 33 of gold. Woven dielectric fiber 35 isolates the gates 36, 37 and 38 from other elements. The metal and dielectric fibers support the remaining elements, receiving the stress of the warp and woof of the weaving loom. Thickness of the stressed fibers depend upon the fabric dimension, where a larger area warp-to-woof requires thicker dielectric fibers to support the loom tension.

FIG. 2b generally designates a partial planar view of red, green and blue pixels of the woven display. This view of the pixel device 30 is orthogonal to the view shown in FIG. 2a. Woven dielectrics 39, 42 and 45 are in tension, specifically apply force to elements 33, 43 and 46 to contact the underlying EL polymer. The dielectrics 39, 42 and 45 also isolate drain metal 33 and 46, and common source cermet 43, from above lying elements.

FIG. 2c shows a sectional view through the blue pixel, and is orthogonal to views shown in FIGS. 2a and 2b. As shown in FIG. 2c using the gate electrode 38 as an example, the shape of gate electrodes 36, 37, 38 are made narrow in the dimension parallel to the source 43 and drain contacts 33 or 46 to effectively enhance the field created in their respective EL semiconductor by an applied gate potential. Woven dielectric polymer fibers 41 and 42 are in tension and apply force to gates 36, 37 and 38, contact with their respective EL polymer 32, 33 and 34 (see FIGS. 2a, 2b and 2c). Gate metal fibers 36, 37 and 38 are column addressed by color, forming a pixel of the display.

Referring to FIGS. 2a, 2b and 2c collectively, the operation of the gated EL device is as follows. The blue pixel element 34 and its gate 38 will be used as example. It should be understood that the red and green pixel elements 36 and 37 operate in the same manner. In the "off" condition, source 43, drain 33 and gate 38 are all at ground potential. The blue pixel is addressed by a column signal to its gate 38. The column signal can be a positive potential, or a series of duration-modulated positive pulses to modulate the gate. Absent a row address potential to drain 33, no avalanche occurs. If the row of the device is addressed by a positive signal on 33, or a series of positive pulses, synchronized with pulses applied to the gate, controlled avalanche and EL brightness modulation results.

GATED ELECTROLUMINESCENT DISPLAY

Figure 3A:
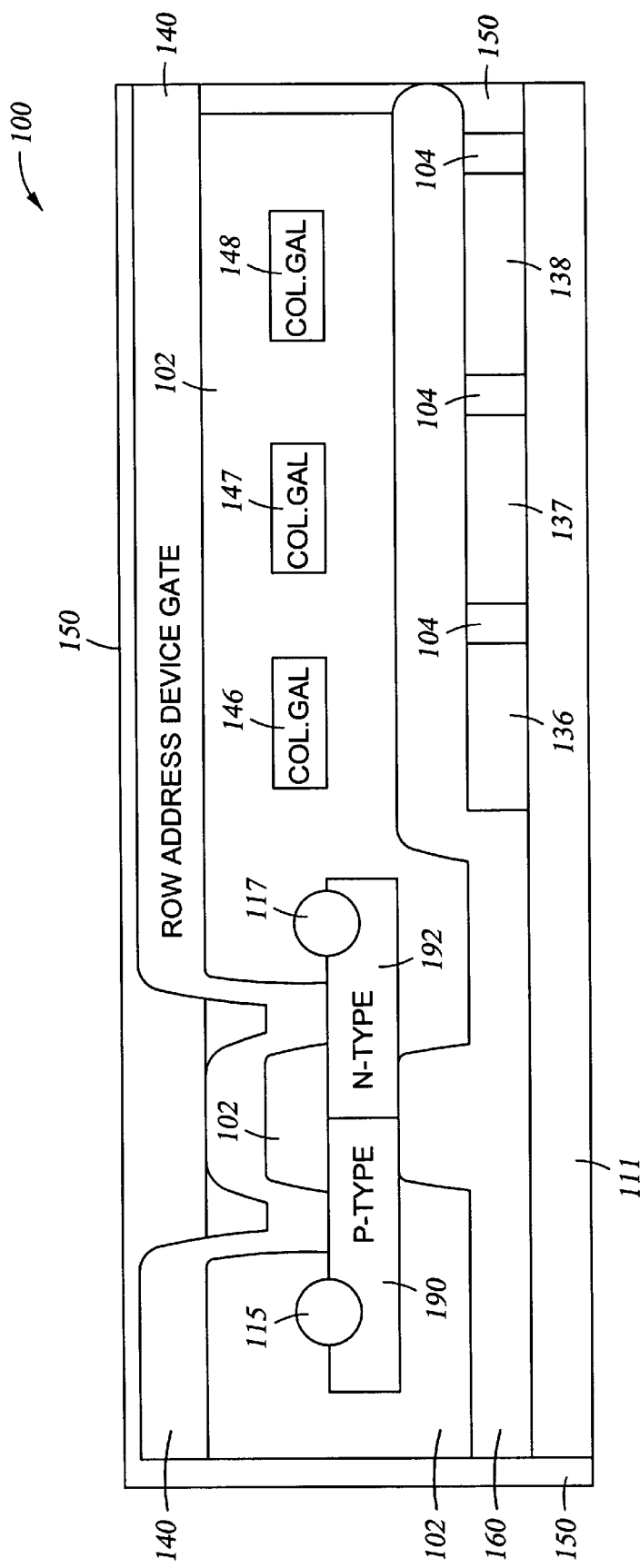
FIG. 3a is a partial planar view of two rows of red, green and blue pixels with connected row address device.
Figure 3C:
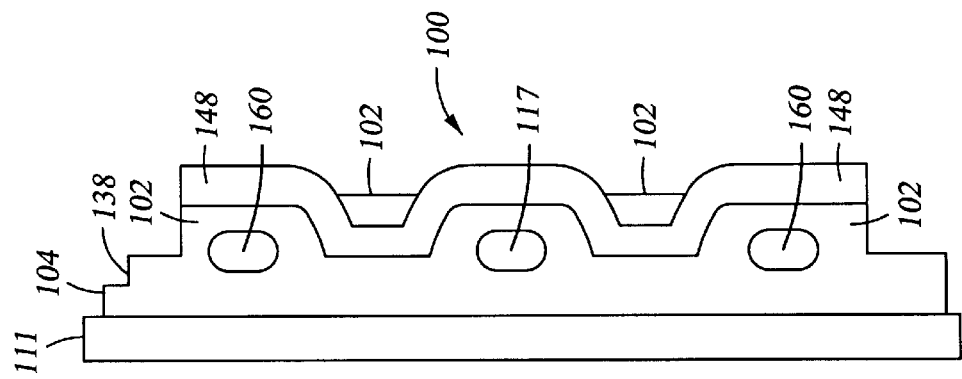
FIG. 3b is a first partial sectional view of two rows of red, green and blue pixels with connected row address device.
FIG. 3 is a second, orthogonal partial planar view of two rows of red, green and blue pixels with connected row address device.
Figure 3B:
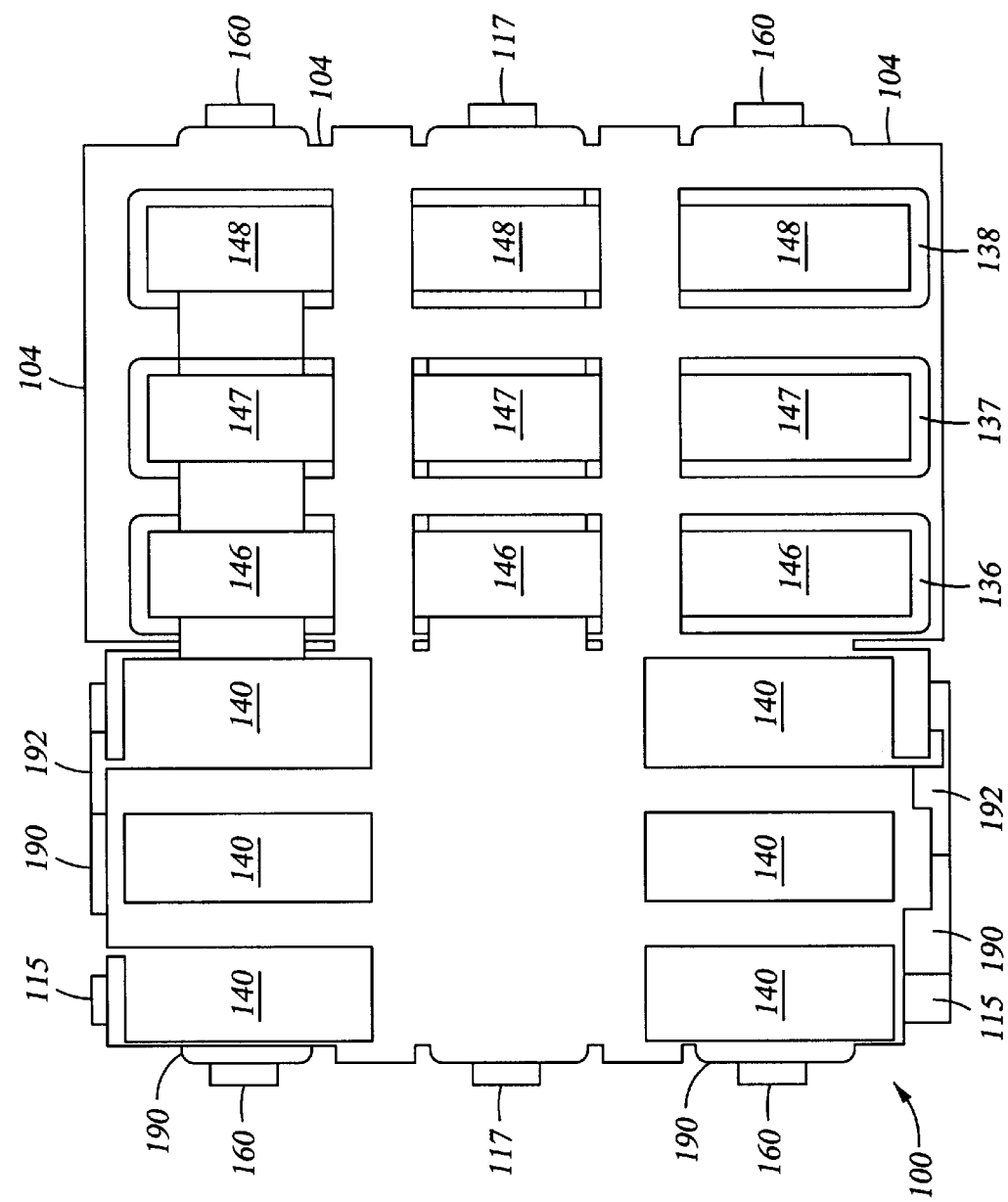

FIGS. 3a, 3b and 3c show a gated electroluminescent display (GELD) of woven fibers and consisting of an address device shown in FIGS. 1a and 1b cooperating with pixels of the type shown in FIGS. 2a, 2b and 2c. FIG. 3a is a planar view and FIGS. 3b and 3c are orthogonal, partial cross sectional views. As in previous illustrations, all fibers are shown terraced and truncated for clarity, but extend in fact to their respective weaving loom edges.

Referring to FIGS. 3a, 3b and 3c together, the GELD is formed on an optically matched transparent substrate 111. The address device again includes a p-type transistor 190 and an n-type transistor 192 in contact with a row address gate 140 and a common row address output 160. The positive terminal of the row address device is identified as 115, and the drain terminal is identified as 117. Insulating dielectric fibers for both the address and pixel elements are identified by the numeral 102, and black insulating fibers are identified by the numeral 104. Polymer red, green and blue polymer electroluminescent semiconductor fibers are identified as 146, 147 and 148, respectively. The GELD device is encapsulated with a polymer material 150. It should be noted that FIG. 3c is a sectional section through the blue EL semiconductor fiber 148, but sectional views through the red and green fibers 146 and 147, respectively, are identical with the exception of the EL fiber type.

SOURCE CONDUCTOR

Figure 4:
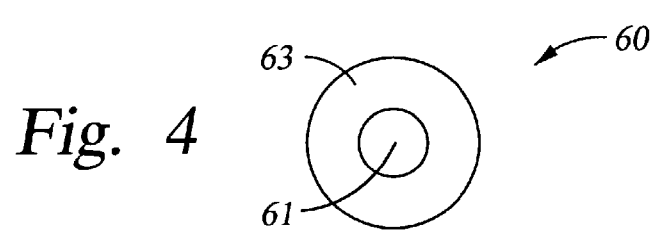
FIG. 4 is a cross-sectional view of the cermet source contact fiber.

Attention is now directed to FIG. 4, which a more detailed, sectional view of the source conductor 43 of FIGS. 2b and 2c. The sectional view of the source contact conductor cermet 43 is generally designated by the numeral 60. Core metal 61 is preferably copper. Surrounding the copper core 61 is a layer 63 of the cermet of $Cr_3Si$ and $SiO_2$. The cermet 63 is deposited in continuous co-deposition of $Cr_3Si$ and $SiO_2$ onto a moving wire or fiber of copper 61 by sputtering. The conductor cermet is the source terminal of the gated EL device shown in FIGS. 2a, 2b and 2c.

SUMMARY

The above disclosure sets forth a woven fabric of semiconductor fibers of electroluminescent (EL), n and p types, together with conductors and insulators, organized in the warp and woof of a weaving loom, to form, interconnect and produce a full color, full function video display of high luminous intensity, definition and area suitable for any video system. Electroluminescence is created by controlled non-destructive avalanche, rather than by tunneling, of carriers in polymer EL semiconductor thereby increasing efficiency and luminous output. The fabric EL display comprises triode, gated, EL devices. Gates control avalanche EL in the EL devices, rather than tunneling of the prior art, by forming a no-barrier, non-tunneling contact between cermet and the EL device source. The display device exhibits increased efficiency of luminous output of an EL devices by effect of the cermet source contact which minimizes hole current and increases EL recombination. The fabric display also exhibits a longer, more reliable operating life for an EL device by eliminating the tunneling contact stresses of prior art, and by use of the gate to produce and control the avalanche and luminous intensity. An interconnect complementary address and other logic devices can be woven with display pixels to provide address and modulation of pixel color and luminous intensity. Furthermore, the manufacturing economies of the textile industry are utilized to the manufacture the fabric video display, and costly equipment and operating expenses associated with prior art flat display fabrication are eliminated. the fabric display is flexible, and adaptable to virtually any video display requirement.

While the foregoing disclosure is directed toward the preferred embodiments of the invention, the scope of the invention is defined by the claims which follow.

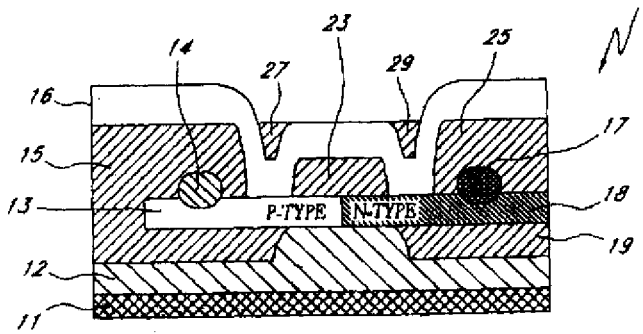

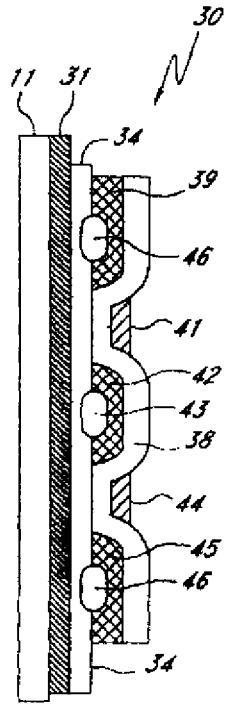

What is claimed is:

1. A video display comprising semiconducting fibers of electroluminescent, conducting fibers and insulating fibers, wherein said semiconducting fibers, said conducting fibers and said insulating fibers are organized in the warp and the woof of a weaving loom and are woven in said loom to produce said video display.

2. The video display of claim 1 wherein:
   (a) said video display is woven into a fabric; and
   (b) said semiconducting, conducting and insulating fibers bear a stress of said weaving and are allowed to stretch as long as functional integrity is maintained.

3. The video display of claim 1 wherein:
   (a) said semiconducting fibers are polymers; and
   (b) said semiconducting, conducting, and insulating fibers are organized in said warp and woof to form electroluminescent red, blue and green pixels.

4. The video display of claim 1 wherein said semiconducting, conducting, and insulating fibers are organized in said warp and woof to form an address device.

5. The video display of claim 1 wherein said semiconducting, conducting, and insulating fibers are organized in said warp and woof to form a logic device.

6. The video display of claim 1 wherein said semiconducting, conducting, and insulating fibers are organized in said warp and woof to form electroluminescent red, blue and green pixels cooperating with a gate device to form a gated electroluminescent display.

7. The video display of claim 1 wherein said weave of semiconducting fibers of electroluminescent, said conducting fibers and said insulating fibers are affixed to a transparent substrate.

8. The video display of claim 7 said transparent substrate comprises transparent fibers, and said semiconducting fibers of electroluminescent, said conducting fibers and said insulating fibers are integrally woven to said transparent substrate.

9. The video display of claim 1 wherein:
   (a) said semiconducting fibers are polymers and are n and p-type semiconductors;
   (b) said conducting fibers function as a source conductor and a drain conductor;
   (c) said source conductor is in ohmic contact with said p-type semiconductor; and
   (d) said drain conductor is in ohmic contact with said n-type semiconductor.

10. The video display of claim 9 wherein said source conductor comprises a copper core surrounded by a layer of cermet.

11. The video display of claim 9 wherein said conducting fibers function as:
   (a) a gate contacting said n-type and said p-type semiconductors; and
   (b) an output contacting said n-type and said p-type semiconductors; wherein said ohmic contacts
      (1) allow said gate solely to produce a depletion region in said semiconductors, and
      (2) allow said gate to control the conduction path between said source conductor and said output and said drain to either OFF or AVALANCHE conditions depending upon a potential applied to said gate.

12. A fabric video display comprising semiconducting fibers, conducting fibers and insulating fibers woven on a loom and which are organized in the warp and the woof of said loom so that they contact one another to form cooperating pixel, address and logic elements of said display.

* * * * *

UNITED STATES PATENT AND TRADEMARK OFFICE
CERTIFICATE OF CORRECTION

PATENT NO. : 6,229,259 B1
DATED : May 8, 2001
INVENTOR(S) : Christensen, Sr.

It is certified that error appears in the above-identified patent and that said Letters Patent is hereby corrected as shown below:

Title page,
Item [56], U.S. PATENT DOCUMENTS, please replace "5,747,928" with
-- 5,747,928 A --; and please replace "6,008,588" with -- 6,008,588 A --.

Column 1,
Line 51, please replace "though" with -- through --.

Column 4,
Line 13, please delete the "." after "equilibrium".
Line 62, please replace " 3" with -- 3C --.

Column 5,
Please re-align the table to conform to the specification.

Column 7,
Line 43, please replace " which" with -- which is --.

Signed and Sealed this

Twenty-sixth Day of November, 2002

Attest:

Attesting Officer

JAMES E. ROGAN
Director of the United States Patent and Trademark Office

UNITED STATES PATENT AND TRADEMARK OFFICE
CERTIFICATE OF CORRECTION

| | | |
|---|---|---|
| PATENT NO. | : 6,229,259 B1 | |
| APPLICATION NO. | : 09/218233 | |
| DATED | : May 8, 2001 | |
| INVENTOR(S) | : Christensen, Sr. | |

It is certified that error appears in the above-identified patent and that said Letters Patent is hereby corrected as shown below:

The title page, showing an illustrative figure, should be deleted and substitute therefor the attached title page.

UNITED STATES PATENT AND TRADEMARK OFFICE
CERTIFICATE OF CORRECTION

| | | |
|---|---|---|
| PATENT NO. | : 6,229,259 B1 | |
| APPLICATION NO. | : 09/218233 | |
| DATED | : May 8, 2001 | |
| INVENTOR(S) | : Christensen, Sr. | |

It is certified that error appears in the above-identified patent and that said Letters Patent is hereby corrected as shown below:

In the drawings, Sheet 1, Fig. 1a should appear as follows:

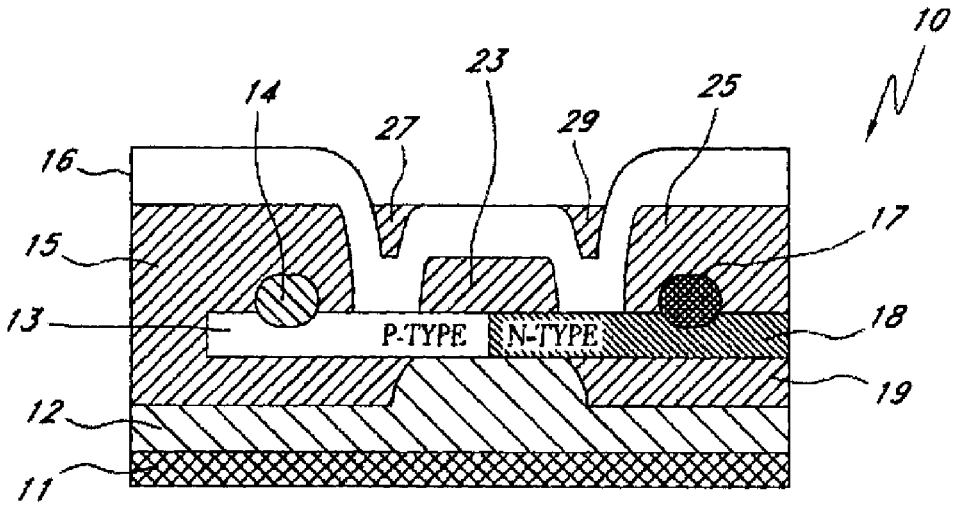

FIG. 1A

UNITED STATES PATENT AND TRADEMARK OFFICE
CERTIFICATE OF CORRECTION

PATENT NO.        : 6,229,259 B1
APPLICATION NO.   : 09/218233
DATED             : May 8, 2001
INVENTOR(S)       : Christensen, Sr.

It is certified that error appears in the above-identified patent and that said Letters Patent is hereby corrected as shown below:

In the drawings, Sheet 1, Fig. 1b should appear as follows:

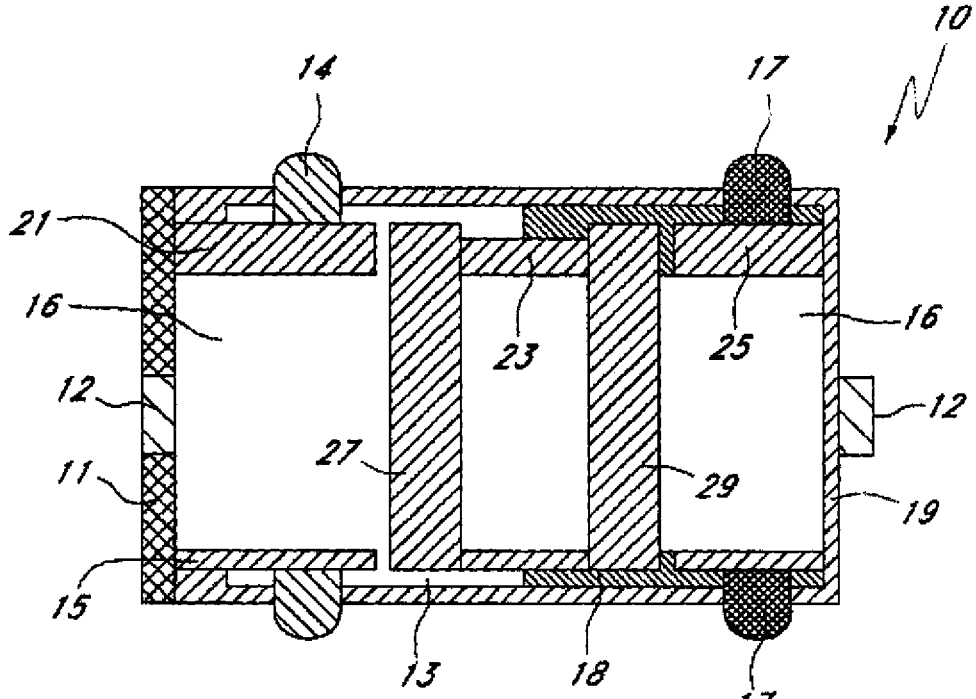

FIG. 1B

UNITED STATES PATENT AND TRADEMARK OFFICE
CERTIFICATE OF CORRECTION

PATENT NO. : 6,229,259 B1  Page 4 of 10
APPLICATION NO. : 09/218233
DATED : May 8, 2001
INVENTOR(S) : Christensen, Sr.

It is certified that error appears in the above-identified patent and that said Letters Patent is hereby corrected as shown below:

In the drawings, Sheet 2, Fig. 2a should appear as follows:

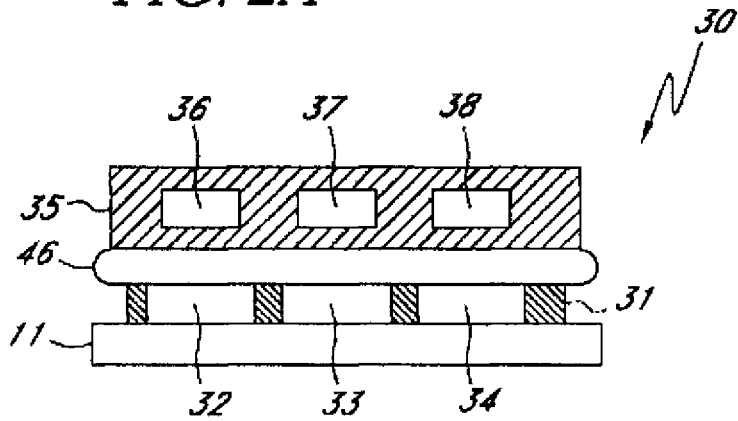

UNITED STATES PATENT AND TRADEMARK OFFICE
CERTIFICATE OF CORRECTION

PATENT NO. : 6,229,259 B1
APPLICATION NO. : 09/218233
DATED : May 8, 2001
INVENTOR(S) : Christensen, Sr.

It is certified that error appears in the above-identified patent and that said Letters Patent is hereby corrected as shown below:

In the drawings, Sheet 2, Fig. 2b and Fig. 2c should appear as follows:

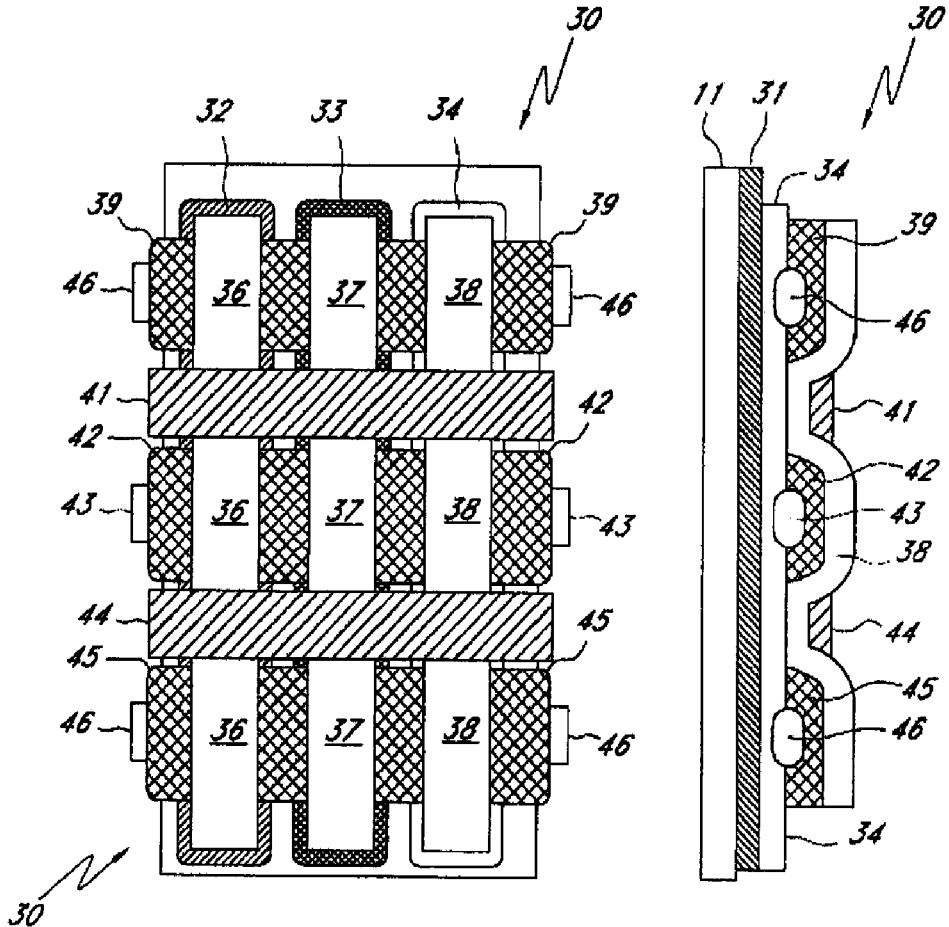

FIG. 2B      FIG. 2C

UNITED STATES PATENT AND TRADEMARK OFFICE
CERTIFICATE OF CORRECTION

| | | |
|---|---|---|
| PATENT NO. | : 6,229,259 B1 | |
| APPLICATION NO. | : 09/218233 | |
| DATED | : May 8, 2001 | |
| INVENTOR(S) | : Christensen, Sr. | |

It is certified that error appears in the above-identified patent and that said Letters Patent is hereby corrected as shown below:

In the drawings, Sheet 4, Fig. 3b should appear as follows:

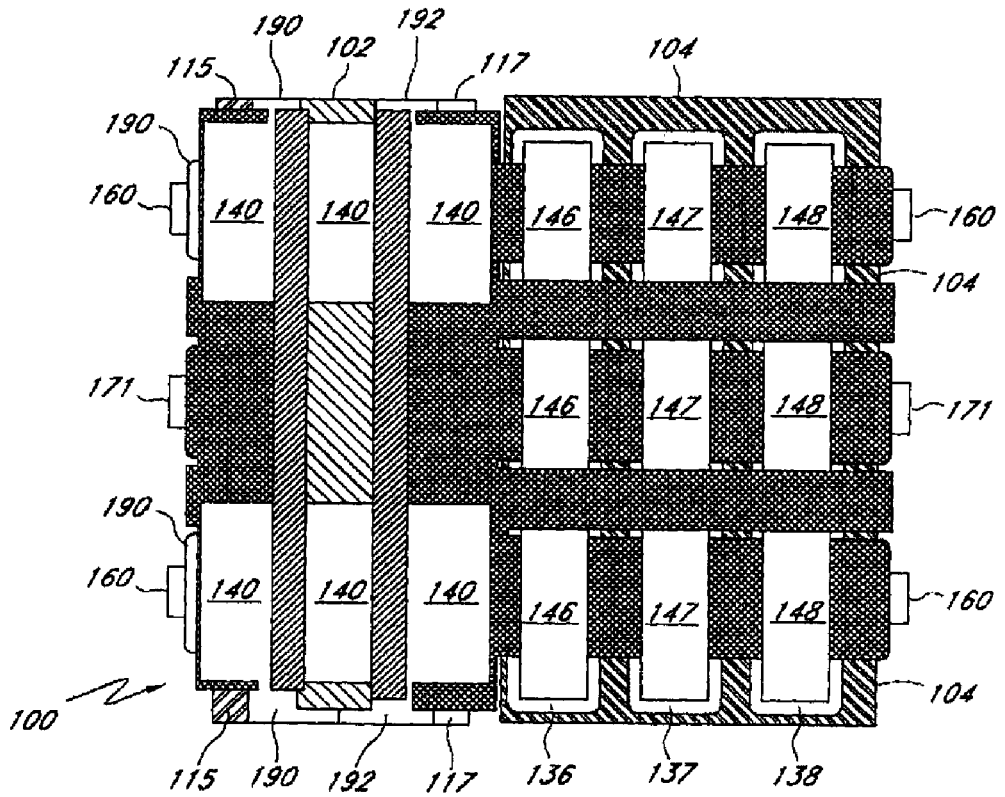

FIG. 3B

UNITED STATES PATENT AND TRADEMARK OFFICE
CERTIFICATE OF CORRECTION

PATENT NO.        : 6,229,259 B1                                   Page 7 of 10
APPLICATION NO. : 09/218233
DATED                 : May 8, 2001
INVENTOR(S)       : Christensen, Sr.

It is certified that error appears in the above-identified patent and that said Letters Patent is hereby corrected as shown below:

In the drawings, Sheet 4, Fig. 3c should appear as follows:

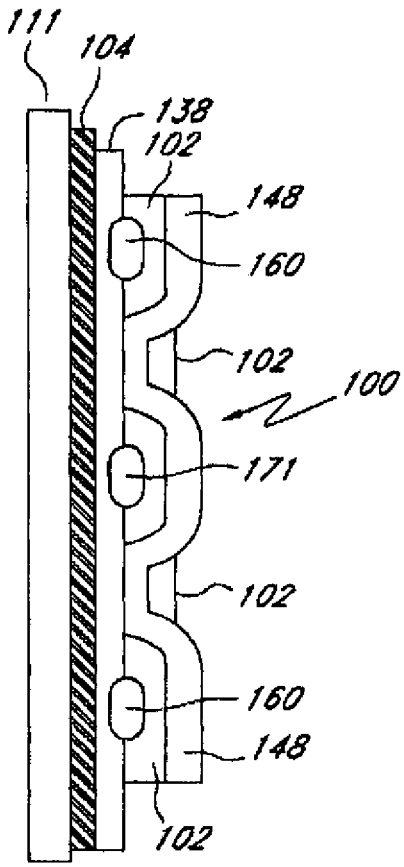

FIG. 3C

UNITED STATES PATENT AND TRADEMARK OFFICE
CERTIFICATE OF CORRECTION

PATENT NO.          : 6,229,259 B1
APPLICATION NO. : 09/218233
DATED                    : May 8, 2001
INVENTOR(S)        : Christensen, Sr.

It is certified that error appears in the above-identified patent and that said Letters Patent is hereby corrected as shown below:

In Column 2, Line 51, delete "cermets." and insert -- cermets, --, therefor.

In Column 4, Line 46, delete "lull" and insert -- full --, therefor.

In Column 4, Line 59 (Approx.), delete "3a" and insert -- 3b --, therefor.

In Column 4, Line 61, delete "3b" and insert -- 3a --, therefor.

In Column 6, Line 18, delete "source 14" and insert -- the drain 17 --, therefor.

In Column 6, Line 20, delete "drain" and insert -- source 14 --, therefor.

In Column 6, Line 39, delete "33" and insert -- 46 --, therefor.

In Column 6, Line 50, delete "33".

In Column 6, Line 52, delete "33 and".

In Column 6, Line 58, delete "33 or".

In Column 6, Line 61, delete "42" and insert -- 44 --, therefor.

In Column 7, Line 2, delete "36" and insert -- 32 --, therefor.

In Column 7, Line 3, delete "37" and insert -- 33 --, therefor.

In Column 7, Line 4, delete "33" and insert -- 46 --, therefor.

In Column 7, Line 8, delete "33" and insert -- 46 --, therefor.

In Column 7, Line 10, delete "33" and insert -- 46 --, therefor.

In Column 7, Line 18, delete "3a" and insert -- 3b --, therefor.

In Column 7, Line 19, delete "3b" and insert -- 3a --, therefor.

UNITED STATES PATENT AND TRADEMARK OFFICE
CERTIFICATE OF CORRECTION

PATENT NO. : 6,229,259 B1
APPLICATION NO. : 09/218233
DATED : May 8, 2001
INVENTOR(S) : Christensen, Sr.

It is certified that error appears in the above-identified patent and that said Letters Patent is hereby corrected as shown below:

In Column 7, Line 34 (Approx.), delete "146, 147 and 148" and insert -- 136, 137 and 138 --, therefor.

In Column 7, Line 37 (Approx.), delete "148" and insert -- 138 --, therefor.

In Column 7, Line 38 (Approx.), delete "146 and 147" and insert -- 136 and 137 --, therefor.

Signed and Sealed this

Ninth Day of June, 2009

JOHN DOLL
*Acting Director of the United States Patent and Trademark Office*

(12) United States Patent
Christensen, Sr.

(10) Patent No.: US 6,229,259 B1
(45) Date of Patent: May 8, 2001

(54) WOVEN POLYMER FIBER VIDEO DISPLAYS WITH IMPROVED EFFICIENCY AND ECONOMY OF MANUFACTURE

(76) Inventor: Alton O. Christensen, Sr., 16106 S. Ravenswood, Magnolia, TX (US) 77355-1233

(*) Notice: Subject to any disclaimer, the term of this patent is extended or adjusted under 35 U.S.C. 154(b) by 0 days.

(21) Appl. No.: 09/218,233

(22) Filed: Dec. 22, 1998

(51) Int. Cl.⁷ .................................................. H05B 33/00

(52) U.S. Cl. .............................. 313/498; 313/506; 257/40

(58) Field of Search .................................. 313/498, 499, 313/500, 506, 511; 428/690, 917; 257/40

(56) References Cited

U.S. PATENT DOCUMENTS 4,849,673 * 7/1989 Werring et al. ............... 313/498 X
5,747,928 * 5/1998 Shamuks et al. ................. 313/498
6,008,588 * 12/1999 Fuji ................................. 313/498 X

* cited by examiner

*Primary Examiner*—Ashok Patel
(74) *Attorney, Agent, or Firm*—Thomason, Moser & Patterson, L.L.P.

(57) ABSTRACT

A flat-panel video display woven of dielectric, conducting and semiconducting fibers is disclosed. The display device is fabricated from a warp and woof fabric of gated triode devices including red, green and blue gated electroluminescent (EL) devices, address devices, and controlling logic elements. The fibers and dimensions thereof substitute for and eliminate expensive deposition and photolithography steps of prior art. Insulating (dielectric) and metal fibers bear the warp and woof stress of a weaving loom used to fabricate the fabric display. Pixel density of the display is proportional to the EL polymer fiber width ranging from submicron to millimeter. For constant pixel density at increasing display size, the thickness of the stressed fibers, and of the display panel, increases. The resulting display has an overall area, or number of displays of a woven batch, limited only by the weaving loom's capability and the breaking point of the insulating fibers used to bear stress. The woven display pixel density can be superior to that of cathode ray tubes (CRTs), and is suitable for automotive, head-mounted, wearable, portable, large area high density television (HDTV), warfighter and tactical commanders' displays. Triode devices produce red, green and blue EL by gate-controlled avalanche processes, more efficient with higher luminous output than the prior art tunneling method. The non-tunneling device source contact, which enables gate-control, also blocks hole current for more efficient luminescent carrier recombination. The fabric comprising the pixels and control circuitry is encapsulated in a polymer having advantageous optical interface parameters with the luminescent face of pixels.

12 Claims, 4 Drawing Sheets